US007351996B2

(12) United States Patent
Tavkhelidze et al.

(10) Patent No.: US 7,351,996 B2
(45) Date of Patent: Apr. 1, 2008

(54) METHOD OF INCREASING EFFICIENCY OF THERMOTUNNEL DEVICES

(75) Inventors: Avto Tavkhelidze, Tbilisi (GE); Vasiko Svanidze, Tbilisi (GE); Magnus Larsson, Lund (SE)

(73) Assignee: Borealis Technical Limited (GI)

( * ) Notice: Subject to any disclaimer, the term of this patent is extended or adjusted under 35 U.S.C. 154(b) by 0 days.

(21) Appl. No.: 11/289,206

(22) Filed: Nov. 28, 2005

(65) Prior Publication Data

US 2006/0192196 A1 Aug. 31, 2006

Related U.S. Application Data

(63) Continuation-in-part of application No. 10/534,633, filed as application No. PCT/IB03/06484 on Nov. 27, 2003.

(30) Foreign Application Priority Data

Nov. 27, 2002 (GB) .................... 0227687.1
Nov. 26, 2004 (GB) .................... 0425941.2

(51) Int. Cl.
*H01L 29/06* (2006.01)
(52) U.S. Cl. .................. 257/30; 257/25; 257/467; 257/468; 257/930
(58) Field of Classification Search ................ 310/306, 310/307; 313/311; 257/25, 30, 467, 468, 257/930, E39.013, E27.008, E29.042
See application file for complete search history.

(56) References Cited

U.S. PATENT DOCUMENTS 3,169,200 A * 2/1965 Huffman .................. 310/306

| 4,747,698 | A  | * | 5/1988  | Wickramasinghe et al. .... 374/6 |
| 6,064,137 | A  | * | 5/2000  | Cox ........................... 310/306 |
| 6,365,912 | B1 | * | 4/2002  | Booth et al. .................. 257/39 |
| 6,417,060 | B2 |   | 7/2002  | Tavkhelidze et al. |
| 6,720,704 | B1 |   | 4/2004  | Tavkhelidze et al. |
| 2001/0046749 | A1 |   | 11/2001 | Tavkhelidze et al. |
| 2002/0171078 | A1 | * | 11/2002 | Eliasson et al. ............... 257/25 |
| 2003/0168957 | A1 | * | 9/2003  | Sung .......................... 313/311 |

FOREIGN PATENT DOCUMENTS

WO       WO99/10688 A1    3/1999
WO       WO 99/13562 A1   3/1999

OTHER PUBLICATIONS

Tavkhelidze et al., "Electron tunneling through large area vacuum gap",Thermoelectrics, 2002. Proceedings ICT '02., Aug. 25, 2002, pp. 435-438, Piscataway; NJ, USA.
Hishinuma et al., "Refrigeration by combined tunneling and thermionic emmission in vacuum: Use of nanometer scale design", Appl Phys Lett, Apr. 23, 2001, pp. 2572-2574, vol. 78,No. 17.

* cited by examiner

*Primary Examiner*—Minhloan Tran
*Assistant Examiner*—Benjamin Tzu-Hung Liu

(57) ABSTRACT

The present invention comprises a tunneling device in which the collector electrode is modified so that tunneling of higher energy electrons from the emitter electrode to the collector electrode is enhanced. In one embodiment, the collector electrode is contacted with an insulator layer, preferably aluminum or silicon nitride, disposed between the collector and emitter electrodes. The present invention additionally comprises a method for enhancing tunneling of higher energy electrons from an emitter electrode to a collector electrode, the method comprising the step of contacting the collector electrode with an insulator, preferably aluminum or silicon nitride, and placing the insulator between the collector electrode and the emitter electrode.

20 Claims, 3 Drawing Sheets

2a

2b

3a

3b

METHOD OF INCREASING EFFICIENCY OF THERMOTUNNEL DEVICES

CROSS-REFERENCE TO RELATED APPLICATIONS

This application claims the benefit of U.K. Provisional Application No. GB0425941.2, filed Nov. 26, 2004. This application is a Continuation-in-Part of U.S. patent application Ser. No. 10/534,633, which is the U.S. national stage application of International Application PCT/IB2003/006484, filed Nov. 27, 2003, and which designates the United States, which international application was published on Jun. 10, 2004, as International Publication WO04049379 in the English language. International Application No. PCT/IB2003/006484 claims the benefit of GB Patent Application No. 0227687.1 filed on Nov. 27, 2002.

BACKGROUND OF THE INVENTION

This invention relates to thermotunneling and thermionic devices.

Simple thermotunnel device comprising two metallic electrodes separated by vacuum gap has energy diagram shown in FIG. 1 (image charge modification of the barrier shape is omitted for simplicity). 10 and 12 are metallic electrodes separated by a distance $d_0$ in a vacuum (U.S. Pat. No. 6,417,060; WO99/13562). The cooling power and efficiency of such devices have been calculated by Hishinuma et al. [Appl. Phys. Letters (2001) 78(17):2572-2574], who show that that electrons having a wide spectrum of energies take part in heat pumping. Thus, both electrons 14 sitting at low energy levels (around the Fermi level, $f_e$) and electrons sitting at higher energy levels 16 take part in tunneling through the potential barrier and transfer heat from electrode 10 to electrode 12 (see FIG. 1; for simplicity it is assumed that work functions, $\Phi$, of two electrodes are equal and equal to applied voltage eVbias). Tunneling of low energy electrons leads to low efficiency heat pumping. Pumping of low energy electron requires the same work from external source as pumping of high energy electron ($eV_{bias}$ in both cases). At the same time low energy electrons remove less heat from the emitter than high energy electron. Besides that in some cases tunneling of low energy elelctron might cause negative heat flow.

BRIEF SUMMARY OF THE INVENTION

From the foregoing, it may be appreciated that a need has arisen for a means for shifting to higher energies the spectrum of energies of electrons that are involved in tunneling.

The present invention comprises a tunneling device in which the collector electrode is modified so that tunneling of higher energy electrons from the emitter electrode to the collector electrode is enhanced.

In one embodiment, the collector electrode is in contact with an insulator layer disposed between the collector and emitter electrodes.

The present invention additionally comprises a method for enhancing tunneling of higher energy electrons from an emitter electrode to a collector electrode, the method comprising the step of contacting the collector electrode with an insulator, and placing the insulator between the collector electrode and the emitter electrode.

The present invention additionally comprises a method for cooling comprising applying a bias voltage to an emitter electrode; placing a collector electrode a distance $d_0$ from the emitter electrode; placing an insulator layer a distance $d_1$ from the emitter electrode; and contacting the insulator layer and the collector layer, whereby electrons tunneling from the emitter electrode to the collector electrode and the emitter electrode, thereby cooling the emitter electrode.

BRIEF DESCRIPTION OF THE SEVERAL VIEWS OF THE DRAWING

For a more complete explanation of the present invention and the technical advantages thereof, reference is now made to the following description and the accompanying drawing in which.

DETAILED DESCRIPTION OF THE INVENTION

Figure 1:
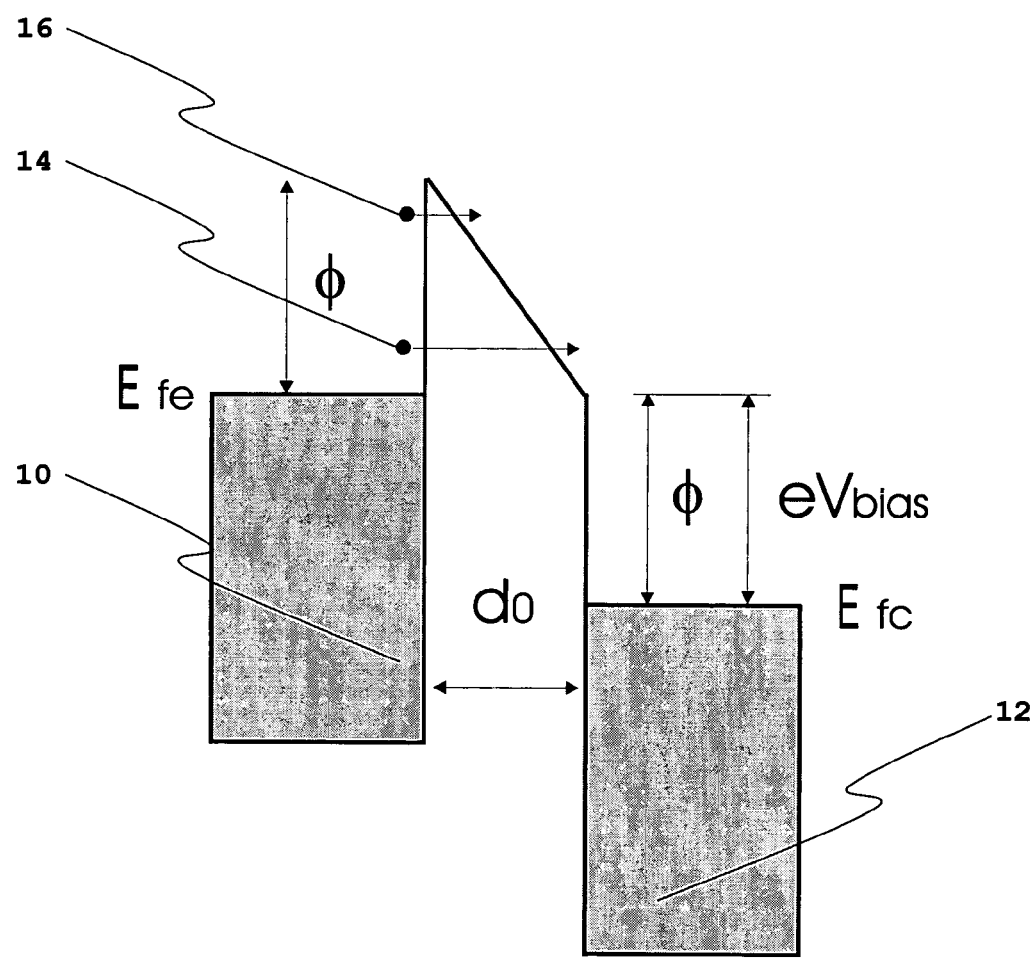
FIG. 1 is a diagrammatic representation of energy levels in prior art tunneling devices.
Figure 2:
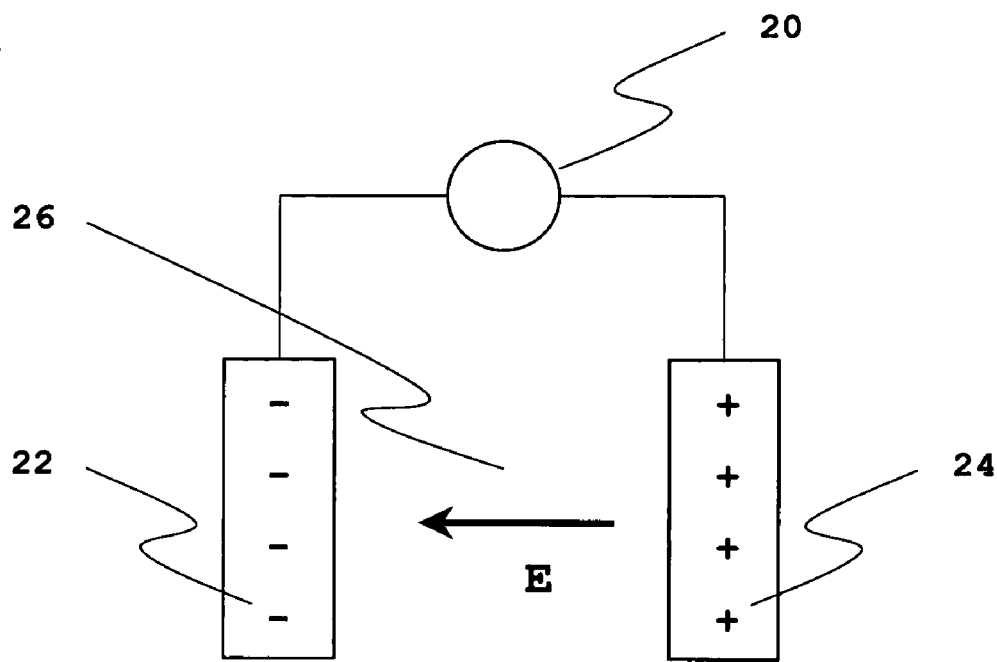
FIG. 2 is a diagrammatic representation of prior art tunneling devices (FIG. 2a) and a tunneling device of the present invention (FIG. 2b).
Figure 2:
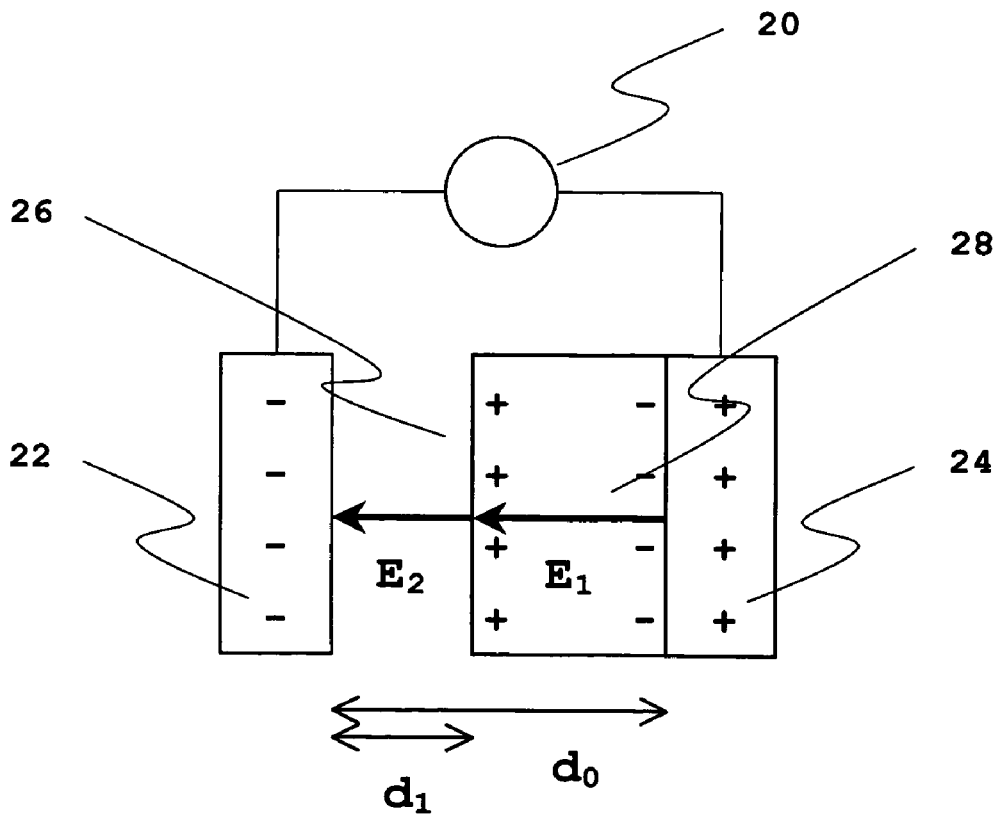
Figure 3:
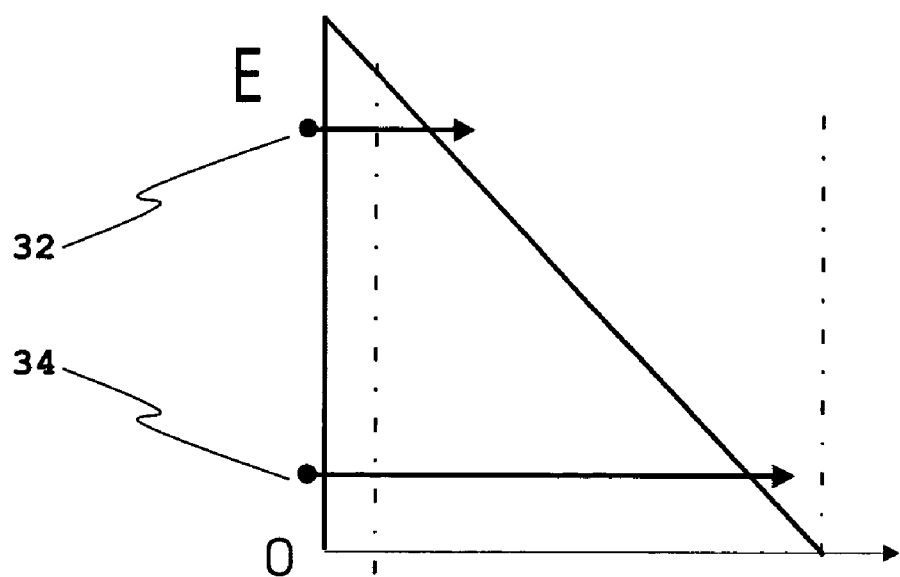
FIG. 3 is a diagrammatic representation of potential energy-distance profiles for prior art tunneling devices (FIG. 3a) and a tunneling device of the present invention (FIG. 3b).
Figure 3:
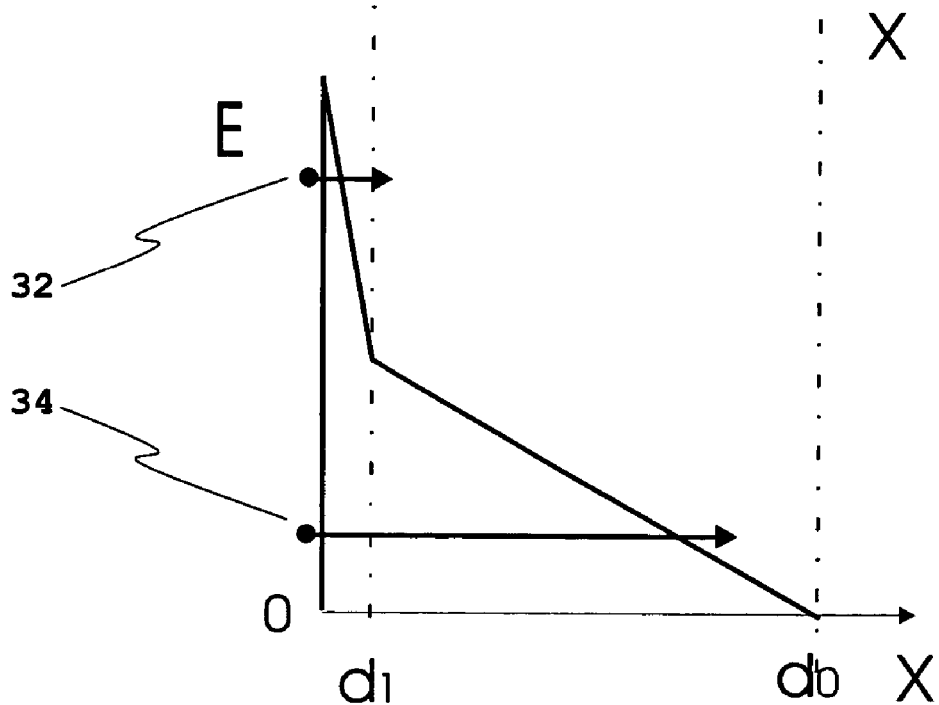

Embodiments of the present invention and their technical advantages may be better understood by referring to FIGS. 2 and 3.

It is well known that when an electric field E is applied to an insulator it causes polarization of the insulator atoms and the resulting field is decreased inside the insulator. Thus the field inside the insulator, $E_1$ is equal to $E/\epsilon$, where $\epsilon$ is the dielectric constant of the insulator.

Referring now to FIG. 2a, which shows a prior art tunneling device, an emitter electrode 22 and a collector electrode 24 are separated by a vacuum gap. Upon application of an external voltage 20, $V_{bias}$, the field in the vacuum area between the electrodes is E.

Referring now to FIG. 3a, which shows the relationship between potential energy E and electrode separation X for the two electrodes of FIG. 2a, high energy electrons 32 and low energy electrons 34 are able to tunnel across the energy barrier. The high energy electrons have to overcome a thinner barrier than the low energy electrons, but the lower energy levels around the Fermi level are much more highly populated than the higher energy levels, and thus the efficiency of heat pumping is low, as discussed above.

Referring now to FIG. 2b, which shows a tunneling device of the present invention, in addition to electrodes 22 and 24, an insulator 28 is placed between the electrodes and attached to the collector electrode. This creates a field $E_1$ inside the insulator layer and field $E_2$ in the vacuum between the insulator and metallic electrode. The field inside the insulator will therefore decrease and the field in vacuum gap between the insulator and metallic electrode will increase, and thus $E_2 > E > E_1$.

Referring now to FIG. 3b, which shows the relationship between potential energy E and electrode separation X for the two electrodes of FIG. 2b, high energy electrons 32 and low energy electrons 34 are able to tunnel across the energy barrier as in FIG. 3a. Now, however, when the same $V_{bias}$ is applied, the relationship between energy and distance has two slopes: in the range 0-$d_1$, the slope corresponds to field $E_2$ in the vacuum between the insulator and emitter electrode, and in the range $d_1$-$d_0$ the slope corresponds to the field $E_1$ inside the insulator. It is obvious that now the high energy electrons of FIG. 3b have to overcome a thinner barrier than electrons with the same energy in FIG. 3a, while at the same time tunneling conditions for low energy electrons remain approximately the same (compare FIGS. 3a and 3b). In this way, for the electrode arrangement of FIG. 2b, the energy spectrum of the tunneling electrons will shift in the direction of higher energies, which will in turn dramatically increase COP (Coefficient of Performance or useful cooling power).

A further advantage of the present invention is that the insulator layer prevents electrodes from shorting. Electrodes having large areas of surfaces tend to touch each other in some places, which cause local electric short circuits and damage the surfaces of the electrodes. The insulator layer prevents electrodes this, and therefore the device has lower requirements on electrode surface flatness and is easier to make.

The following is given by way of example to illustrate the present invention, and is not intended to limit the scope of the present invention. Referring again to FIG. 2b, which shows a tunneling device of the present invention, an emitter electrode 22 and a collector 24 are separated by a distance $d_0$ of between 10 and 200 Å, preferably 150 Å, and an insulator layer 28 of thickness $d_0$-$d_1$ of between 30 and 195 Å, preferably 120 Å, and the gap between insulator layer 28 and emitter 22 $d_1$ is between 5 and 50 Å, preferably 30 Å. In a preferred embodiment, the insulator layer is a metal oxide. In a particularly preferred embodiment the insulator layer is silicon nitride or aluminum nitride. Field E created by bias voltage 20, $V_{bias}$, is applied across the device. The dielectric constants for silicon nitride and aluminum nitride are about 7.5 and 8.5, respectively, which means that in the first approximation field $E_2$ could be neglected. Consequently the entire field will be concentrated inside thin 30 Å vacuum layer between insulator and metal electrode. The applied voltage, $V_{bias}$, may be therefore be reduced to a approximately a fifth of the value utilized in the absence of the insulator layer to achieve the same field strength.

Furthermore, Hishinuma et al. calculate useful cooling coefficient or COP values for a range of inter-electrode spacing and electrode work functions, and show that COP is inversely proportional to the applied voltage ($V_{bias}$). Thus for the example above the bias voltage could be over four times lower to get the same cooling power. Because COP is inversely proportional to $V_{bias}$ it will result in approximately 5 times increase of COP. In reality COP will increase more than that because of filtering effect of potential barrier.

While this invention has been described with reference to specific embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description.

For example, particular values for the separation of the electrodes, the thickness of the insulator, and the distance between the insulator and the emitter are given in the foregoing. Other values may be used without departing from the scope of the present invention. Thus the distance between the electrodes may be in the range of 10-200 Å, and the distance between the emitter and the insulator layer may be in the range of 5-50 Å.

Specific methods for the fabrication of devices of the present invention have not been given as there are a number of approaches that may be used by one of ordinary skill in the art to achieve the objectives of the present invention. Thus the devices may be fabricated by attaching a preformed insulator layer to the collector electrode, or the insulator layer may be deposited onto the collector electrode.

Thermotunneling devices of the present invention may be used for cooling applications, in which case the emitter electrode is in thermal contact with a heat source, and the collector electrode is in contact with a heat sink.

The invention claimed is:

1. A thermotunneling device comprising a collector electrode, an emitter electrode and a layer of silicon nitride or aluminum nitride wherein a distance between the emitter electrode and the layer is in the range of 5-50 Å and wherein the layer is touching the collector electrode.

2. The thermotunneling device of claim 1 in which the distance between the electrodes is in the range of 10-200 Å.

3. The thermotunneling device of claim 1 in which the emitter electrode comprises a metal.

4. The thermotunneling device of claim 1 in which the collector electrode comprises a metal.

5. The thermotunneling device of claim 1 in which said layer covers said collector electrode.

6. The thermotunneling device of claim 1 wherein the insulator layer has a thickness in the range of 30-195 Å.

7. The thermotunneling device of claim 1 wherein the insulator layer has a thickness of the order of 120 Å.

8. A method for enhancing electron tunneling between an emitter and collector electrode comprising the step of placing an insulator layer comprises silicon nitride or aluminum nitride between the collector electrode and the emitter electrode such that the insulator layer is in contact with the collector electrode and is between 5and 50 Å from the emitter electrode.

9. The method of claim 8 additionally comprising the step of placing the collector electrode between 10 and 200 Å from the emitter electrode.

10. The method of claim 8 in which the emitter electrode comprises a metal.

11. The method of claim 8 in which the collector electrode comprises a metal.

12. The method device of claim 8 in which said layer covers said collector electrode.

13. The method of claim 8 wherein the insulator layer has a thickness in the range of 30-195 Å.

14. A method for cooling comprising the steps:
(a) placing a collector electrode a distance $d_0$ from an emitter electrode;
(b) placing an insulator layer a distance $d_1$ from the emitter electrode, the insulator layer comprising silicon nitride or aluminum nitride and having a thickness of $d_0$-$d_1$; and
(c) contacting the insulator layer and the collector layer;
(d) applying a bias voltage $V_{bias}$ to said emitter electrode thereby creating a field $E_1$ in said insulator and a field $E_2$ in a region between said insulator layer and said emitter;
wherein a barrier for tunneling of high energy electrons is thinner than in the absence of said insulator layer but a barrier for tunneling of low energy electrons is approximately the same as in the absence of said insulator whereby an energy spectrum of the tunneling electrons will shift in the direction of higher energies, thereby enhancing a Coefficient of Performance for cooling.

15. The method of claim 14 in which $d_0$ is in the range of 10-200 Å.

16. The method of claim 14 in which $d_1$ is in the range of 5-50 Å.

17. The method of claim 14 in which the emitter electrode comprises a metal.

18. The method of claim 14 in which the collector electrode comprises a metal.

19. The method of claim 14 wherein the insulator layer has a thickness in the range of 30-195 Å.

20. The method of claim 14 wherein the insulator layer has a thickness of the order of 120 Å.

* * * * *